July 28, 1964 R. U. PRESS 3,142,484
ASSEMBLY FOR BENDING ELECTRICAL COMPONENT AXIAL LEADS
Filed Aug. 9, 1962
FIG. 1
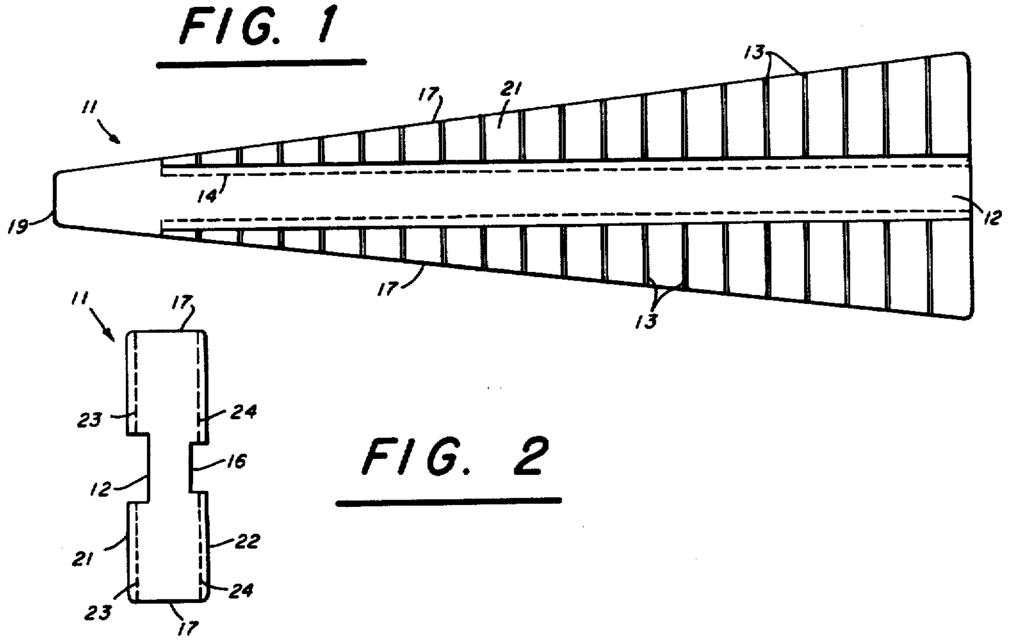
FIG. 1, FIG. 2
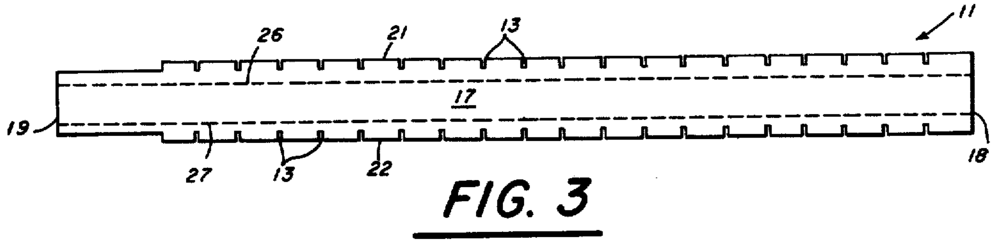
FIG. 3
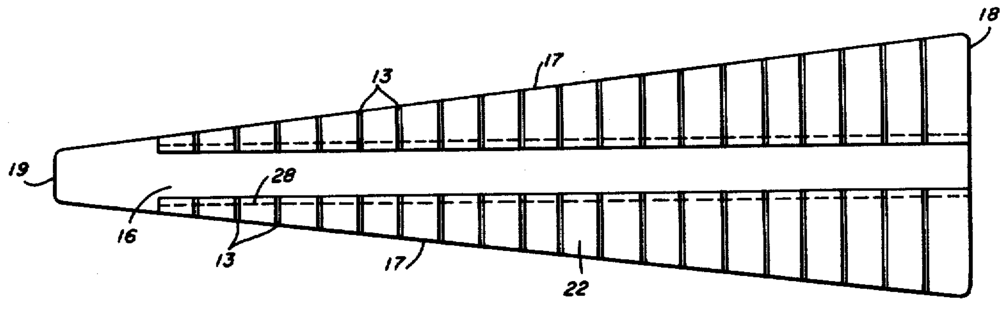
FIG. 4
INVENTOR.
RICHARD U. PRESS
BY Richard K. MacNeill

United States Patent Office 3,142,484

Patented July 28, 1964

3,142,484
ASSEMBLY FOR BENDING ELECTRICAL COMPONENT AXIAL LEADS

Richard U. Press, 6333 Balsam Lake Ave., San Diego 19, Calif.

Filed Aug. 9, 1962, Ser. No. 215,904
6 Claims. (Cl. 269—303)

This invention relates to a bending assembly for bending electrical component axial leads and more particularly to a bending assembly for bending electrical component axial leads which provides for bending the axial leads in different incremental lengths.

Since the advent of the printed circuit board requiring the mounting of components thereon having their axial leads bent at right angles to the body of the component, there has existed a need for a simple assembly allowing for these right angle bends to be made in incremental lengths or distances away from the component itself. More specifically the chief problem encountered in the assembly of circuit boards has been in conjunction with relatively fragile parts such as solid state diodes, transistors, etc. With these components it becomes imperative to make a clean bend away from the body of the component or the point at which the axial lead leaves the component with no stress on the bond between the component and the lead which may lead to breakage or a weakening of the component itself. As a practical consideration a bending assembly meeting these requirements should also provide for a variable distance between the component and the bend itself.

According to the invention, a triangular shaped block is provided having one wide groove running from one corner of the triangle to the opposite side for placement of the body of the component whose leads are to be bent. Small grooves for accommodation of pigtail axial leads from the component are provided at right angles to the wide groove housing the body of the component itself. Thus if the body of the component fits snugly into the wide groove and the axial leads lie within the small grooves at right angles to the large grooves a bend can be easily effected across the corners or edges of the triangular shaped block which will place no stress upon the bond between the axial leads and the component itself. Constructing the block in a triangular shape allows for a variable distance between the edge of tthe block where the bend takes place and the wide groove where the component itself is fitted. This allows for a variable distance between the component edges and the bend of its leads. Obviously a groove may be placed on the reverse side of the triangular shaped block to accommodate components of a different size, the reverse side having small grooves identical to the other side for effecting a right angle bend in standard incremental lengths.

It is thus an object of the present invention to provide a bending assembly for bending electrical component axial leads at right angles to the body of a component.

Another object is the provision of a bending assembly for bending electrical component axial leads which places a minimum of stress on the bond between the axial lead and the component itself.

A further object of the invention is to provide a bending assembly for bending electrical component axial leads in discreet incremental lengths.

Yet another object is a provision of an improved bending assembly which is simple, economical and extremely rugged.

Other objects and many of the attendant advantages of this invention will be readily appreciated as the same becomes better understood by reference to the following detailed description when considered in connection with the accompanying drawings in which like reference numerals designate like parts throughout the figures thereof and wherein:

FIG. 1 is a plan view of the preferred embodiment of the present invention;

FIG. 2 is an end view of FIG. 1;

FIG. 3 is a side view of FIG. 1;

FIG. 4 is a bottom view of FIG. 1.

Referring now to the drawings and in particular to FIG. 1 there is shown generally at 11 a triangular shaped block. Block 11 has groove 12 cut in one face thereof and grooves 13 cut at right angles to groove 12. Dotted lines 14 indicate a groove 16 on the opposite face of block 13. Block 11 has edges 17 and base edge 18 and apex 19.

Referring now to FIG. 2 there is shown an end view of FIG. 1 of block 11 having grooves 12 and 16 in faces 21 and 22 respectively. Edges 17 are shown at right angles to faces 21 and 22 and dotted lines 23 and 24 represent lateral grooves 13 at right angles to grooves 12 and 16 respectively.

Referring now to FIG. 3 there is shown one edge 17, apex 19 and base edge 18 of block 11, grooves 13 are shown cutting into faces 21 and 22 and grooves 12 and 16 are shown by dotted lines 26 and 27 respectively.

Referring to FIG. 4 the opposite face of FIG. 1 is shown at 22 having groove 16 running from base edge 18 to apex 19 and another set of grooves 13 running at right angles to grooves 16, to edges 17. Dotted lines 28 show the boundary of groove 12 in face 21.

The block is preferably dye cast out of aluminum for simplicity of manufacture, a minimum of weight and virtually no wear. In bending component leads, the component depending upon size is placed in slot 12 or 16 of face 21 or 22, respectively. A snug fit will be obtained between the ends of the component body and the walls of the slot and the axial leads of the component are then fitted through one pair of the grooves 13 according to how far away from the edge of the component the bends are desired. The mounting holes on a printed board for example, could dictate the particular pair of grooves 13 that will be utilized for the bends. It can further be seen that if a minimum of care is taken there will be virtually no pressure on the bond between the lead and the component itself as the right angle bend is effected. If desired, the length from one corner to the other i.e. from one edge 17 to the other edge 17 across a given groove 13, can be measured and stamped or printed or even cast on the body of the block itself to effect a calibration of bend length.

While the invention has been described as being dye cast out of aluminum it obviously could be constructed in any one of several ways. Also while each face of the triangular block has been utilized, in this case for different size components, this is merely an economy feature and is not necessary to the invention itself. It is therefore to be understood that within scope of the appended claims the invention may be practiced otherwise than as specifically described.

What is claimed is:

1. A bending assembly for bending electrical component axial leads comprising a triangular shaped block having first and second equal edges linearly converging on one end thereof to an apex and a base edge between the other ends of said equal edges, first and second parallel faces, said faces bordered by said equal edges, first and second grooves of predetermined depth and width in said parallel faces, said grooves being parallel to a line drawn from said apex perpendicular to said base, a plurality of parallel grooves in said faces, said plurality of parallel grooves being perpendicular to said first and second grooves and of less depth than said first and second grooves, said plurality of parallel grooves extending from said first equal edge to said second equal edge.

2. The bending assembly of claim 1 wherein said parallel grooves are spaced in equal increments.

3. A bending assembly for bending electrical component axial leads comprising a triangular shaped block having first and second edges converging on one end thereof to an apex; first and second faces, said faces bordered by said edges; at least one component groove of predetermined depth and width in one of said faces, said groove being parallel to a line bisecting said apex; a plurality of lead grooves intersecting said component groove and extending between said edges, said plurality of lead grooves being of lesser depth than said component grooves.

4. The bending assembly of claim 3 wherein said plurality of lead grooves are perpendicular to said component grooves.

5. The bending assembly of claim 4 wherein said plurality of lead grooves are spaced in equal increments.

6. The bending assembly of claim 3 wherein said plurality of lead grooves are spaced in equal increments.

References Cited in the file of this patent

UNITED STATES PATENTS

| | | |
|---|---|---|
| 1,434,675 | Boone | Nov. 7, 1922 |
| 3,039,498 | Bechtell | June 19, 1962 |